(12) United States Patent
Wan

(10) Patent No.: US 8,680,922 B2
(45) Date of Patent: Mar. 25, 2014

(54) RAIL-TO RAIL INPUT CIRCUIT

(75) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 35 days.

(21) Appl. No.: 13/352,654

(22) Filed: Jan. 18, 2012

(65) Prior Publication Data

US 2013/0181775 A1 Jul. 18, 2013

(51) Int. Cl.
*H03F 3/45* (2006.01)

(52) U.S. Cl.
USPC ............................................. 330/253

(58) Field of Classification Search
USPC ................................. 330/252–261
See application file for complete search history.

(56) References Cited

U.S. PATENT DOCUMENTS

| | | | |
|---|---|---|---|
| 5,414,388 A | 5/1995 | Sauer | |
| 5,550,510 A | 8/1996 | Nagaraj | |
| 5,561,396 A | 10/1996 | Hogervorst et al. | |
| 5,734,297 A | 3/1998 | Huijsing et al. | |
| 5,745,007 A | 4/1998 | Redman-White | |
| 5,764,101 A | 6/1998 | Archer | |
| 5,777,518 A | 7/1998 | Bailey | |
| 5,808,513 A | 9/1998 | Archer | |
| 5,838,199 A | 11/1998 | Nakamura | |
| 5,929,705 A | 7/1999 | Zhang et al. | |
| 6,031,423 A | 2/2000 | Basu | |
| 6,150,883 A | 11/2000 | Ivanov | |
| 6,356,153 B1 | 3/2002 | Ivanov et al. | |
| 6,366,167 B1 | 4/2002 | Stockstad | |
| 6,462,584 B1 | 10/2002 | Proebsting | |
| 6,531,919 B1 | 3/2003 | Carter | |
| 6,559,687 B1 | 5/2003 | Hunt | |
| 6,630,847 B2 | 10/2003 | Hunt | |
| 6,683,497 B2 | 1/2004 | Kimura | |
| 6,870,422 B2 | 3/2005 | Stockstad | |
| 6,977,526 B2 | 12/2005 | Li | |
| 7,042,289 B2 | 5/2006 | Hwang et al. | |
| 7,170,347 B1 | 1/2007 | Kindt | |
| 7,190,227 B2 | 3/2007 | Gilbert | |
| 7,230,487 B2 | 6/2007 | Sung | |
| 7,411,453 B1 | 8/2008 | Ivanov et al. | |
| 7,777,568 B2 | 8/2010 | Lim | |
| 7,863,981 B2 | 1/2011 | Shkidt et al. | |
| 2008/0143441 A1 | 6/2008 | Naito | |
| 2009/0251214 A1 | 10/2009 | Shkidt et al. | |

FOREIGN PATENT DOCUMENTS

WO WO2010135228 11/2010

OTHER PUBLICATIONS

Lee, Edward K.F. et al., "A 0.9 V Rail-to-Rail Constant $g_m$ Amplifier for Implantable Biomedical Applications", 2006 IEEE International Symposium on Circuits and Systems, May 21, 2006, pp. 653-656.
Lee, Edward K.F., "A Sub-0.5V, 1.5µW Rail-to-Rail Constant $g_m$ Opamp and Its Filter Application", 2012 IEEE International Symposium on Circuits and Systems, May 20, 2012, pp. 197-200.
International Search report and Written Opinion for PCT/US2013/021660, Jul. 4, 2013, 13 pages.

*Primary Examiner* — Hieu Nguyen
(74) *Attorney, Agent, or Firm* — Knobbe, Martens, Olson & Bear, LLP

(57) ABSTRACT

A power-efficient, rail-to-rail input circuit includes two differential pairs, one having devices of a first threshold voltage and one having devices of a second, different threshold voltage. In various embodiments, the two differential pairs receive a differential input in parallel and are supplied a tail current, which a control circuit steers between the pairs in accordance with a common-mode level of the input.

22 Claims, 8 Drawing Sheets

RAIL-TO RAIL INPUT CIRCUIT

FIELD OF THE INVENTION

Embodiments of the present invention generally relate to input circuits for amplifiers and comparators and, more particularly, rail-to-rail input amplifiers and comparators.

BACKGROUND

An amplifier is a device that input circuit receives an input signal (e.g., current or voltage) and generates an output signal based on it; some amplifiers may amplify the power, voltage, and/or current of the input signal. A comparator is a device that compares the input signal to a reference, and outputs logic high or low accordingly. For both amplifiers and comparators, their input circuit plays a key role in determining their overall performance such as input common mode range, noise, offset, distortion, bandwidth/speed, etc.

A common type of amplifier is a differential amplifier, which receives positive and negative versions of an input signal and amplifies the difference between them. This type of amplifier is useful in noisy environments because noise that affects the positive and negative versions of the input signal equally (i.e., "common-mode" noise) does not affect their difference and is therefore not amplified. Thus, the common-mode voltage level of the differential inputs may vary within a voltage range without affecting the output of the differential amplifier.

One type of differential amplifier operates on input differential signals having a common-mode voltage anywhere between the power-supply voltage and ground (i.e., a "rail-to-rail" voltage swing). A single differential pair (of MOSFET, BJT, or other types of transistors) is insufficient to handle a rail-to-rail input common-mode range at least because the threshold voltages of the devices in the differential pair, the headroom consumed by bias transistors supporting the differential pair, and/or other factors prevent the single differential pair from remaining on and functional for the entire rail-to-rail range. Thus, differential amplifiers may use two or more complementary differential pairs in order to function properly in a rail-to-rail input common mode range; each differential pair covers part of the range. Similarly, a comparator (or other input circuit) may require complementary transistors to handle a rail-to-rail input common mode range.

For noise, stability, offset, and/or distortion reasons, it may be required that each of the two or more input differential pairs convert the input signal at the same rate so that, for example, a differential signal having a common-mode voltage near the power supply voltage is converted at the same rate as an identical differential signal having a common-mode voltage near ground. Existing circuits typically use complicated and power-hungry control circuitry to ensure that the conversion rates (also known as "transconductance," defined as the change in output current produced by a change in input voltage) are constant, or nearly so, over the entire rail-to-rail range. These circuits are generally expensive to design, manufacture, and operate. Even under some circumstances where constant transconductance may not be absolutely required, however, a compact, efficient, power-conserving input circuit is always desirable. A need therefore exists for a simple, low-power, and robust rail-to-rail input circuit that may be used for amplifiers, comparators, or any other type of devices where input differential pair is needed.

SUMMARY

In various embodiments described herein, a rail-to-rail amplifier uses two differential pairs to cover the entire rail-to-rail common-mode range, wherein the two differential pairs employ transistors having different threshold voltages. For example, the first differential pair may include input transistors having a negative threshold voltage (i.e., the base to emitter or gate to source voltage at which the transistor allows current to flow is less than zero; such devices are sometimes also referred as depletion-mode devices) and the second differential pair may include input transistors having a positive threshold voltage (i.e., current does not flow through the transistor until the base to emitter or gate to source voltage greater than zero is applied thereto; such devices are sometimes also referred as enhancement-mode devices). A simple control circuit (in one embodiment, a single transistor) steers bias current between the first and second differential pair depending on the level of the common-mode voltage. This arrangement, in one embodiment, allows both pairs of input transistors, simultaneously available but individually utilized at different points in the input common-mode level to handle the entire rail-to-rail voltage swing. The differential pairs may share the same bias current source (i.e. tail current) to reduce power consumption and/or may use a constant-current active load, which may be set to output current at a level that improves noise performance. The transconductance of the input circuits may remain nearly constant across the rail-to-rail common-mode range.

In one aspect, a rail-to-rail differential input circuit includes first and second differential pairs, a tail current source, and a control device. The first differential pair includes first devices having a first threshold voltage (e.g., depletion-mode devices) and receives a differential input; the second differential pair includes devices having a second, different threshold voltage (e.g., enhancement-mode devices) and receives the differential input in parallel with the first differential pair. The current source provides a tail current shared between the first and second differential pairs. The control device is connected between common source (or common-emitter) nodes of the first and second differential pairs and steers the tail current between the first and second differential pairs in accordance with a common-mode level of the differential input.

The threshold voltages of the first and second devices may be negative and positive. The control device may be a single transistor. The depletion-mode devices may be MOSFET devices or JFETs, and the enhancement-mode devices may be MOS FET devices, or BJTs. An active load may supply a constant current to the first and second differential pairs. The first differential pair may be on and the second differential pair may be off; the first and second differential pairs may be both on; and the first differential pair may be off and the second differential pair may be on at low, intermediate, and high common-mode levels of the differential input, respectively. Bias voltage sources may supply bias voltages to the tail current source and control device.

In another aspect, a method for processing a differential input voltage having a rail-to-rail common-mode range includes supplying a constant current to a first differential pair having devices of a first threshold voltage (e.g., depletion-mode devices) and to a second differential pair having devices of a second threshold voltage (e.g., enhancement-mode devices). The current is steered to at least one of the first and second differential pairs in accordance with a common-mode level of the differential input voltage. An output signal may be a current signal which is converted from the input voltage signal or a result of comparing the input voltage to a reference.

A tail current may be shared between the first and second differential pairs; the tail current may be constant in some embodiment or adjusted at intermediate common mode levels in some other embodiments if necessary. An output current signal may be provided, which represents the differential input voltage signal in the small signal analysis point of view. A transconductance of the first and second differential pairs may stay constant across the rail-to-rail common-mode range. The first differential pair may convert the input voltage signal into current signal at low common-mode levels and the second differential pair may convert the input voltage signal into current signal at high common-mode levels. The first and second differential pairs may both convert the input voltage signal into current signal at intermediate common-mode levels.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

In general, the transconductance of bipolar transistors (NPN or PNP transistors) may be expressed as $$gm = \frac{I_c}{V_T} \quad (1)$$

where $I_C$ is the DC collector current and $V_T$ is the thermal voltage, typically about 26 mV at room temperature. The transconductance of a MOSFET operating in weak-inversion may be expressed as $$gm = \gamma \frac{I_d}{V_T} \quad (2)$$

where $I_d$ is the DC drain current and $\gamma$ is a constant depending on specific process technology. Therefore, for multiple input differential pairs built with MOSFETs operating in weak inversion and/or bipolar transistors, the total trans-conductance is constant if the total bias current is constant. For MOSFETs operating in strong inversion, an accurate model typically includes several tens parameters. For simplicity, as a first order approximation, $$gm \approx \sqrt{2I_d \cdot \mu \cdot C_{ox} \cdot \frac{W}{L}} \quad (3)$$

where $I_d$ is the drain current, $\mu$ is the mobility of the devices, $C_{ox}$ is the capacitance per unit area of the gate oxide, and W/L is the aspect ratio of the device effective width to its effective length. Its trans-conductance is roughly proportional to the square root of its bias current. As a result, for multiple differential pairs in parallel operating in strong inversion and under constant total bias current, the total trans-conductance increases during the transition region. The disclosed input circuit, having a simple bias scheme, may adjust bias current accordingly during the transition region to keep trans-conductance constant.

Figure 1:
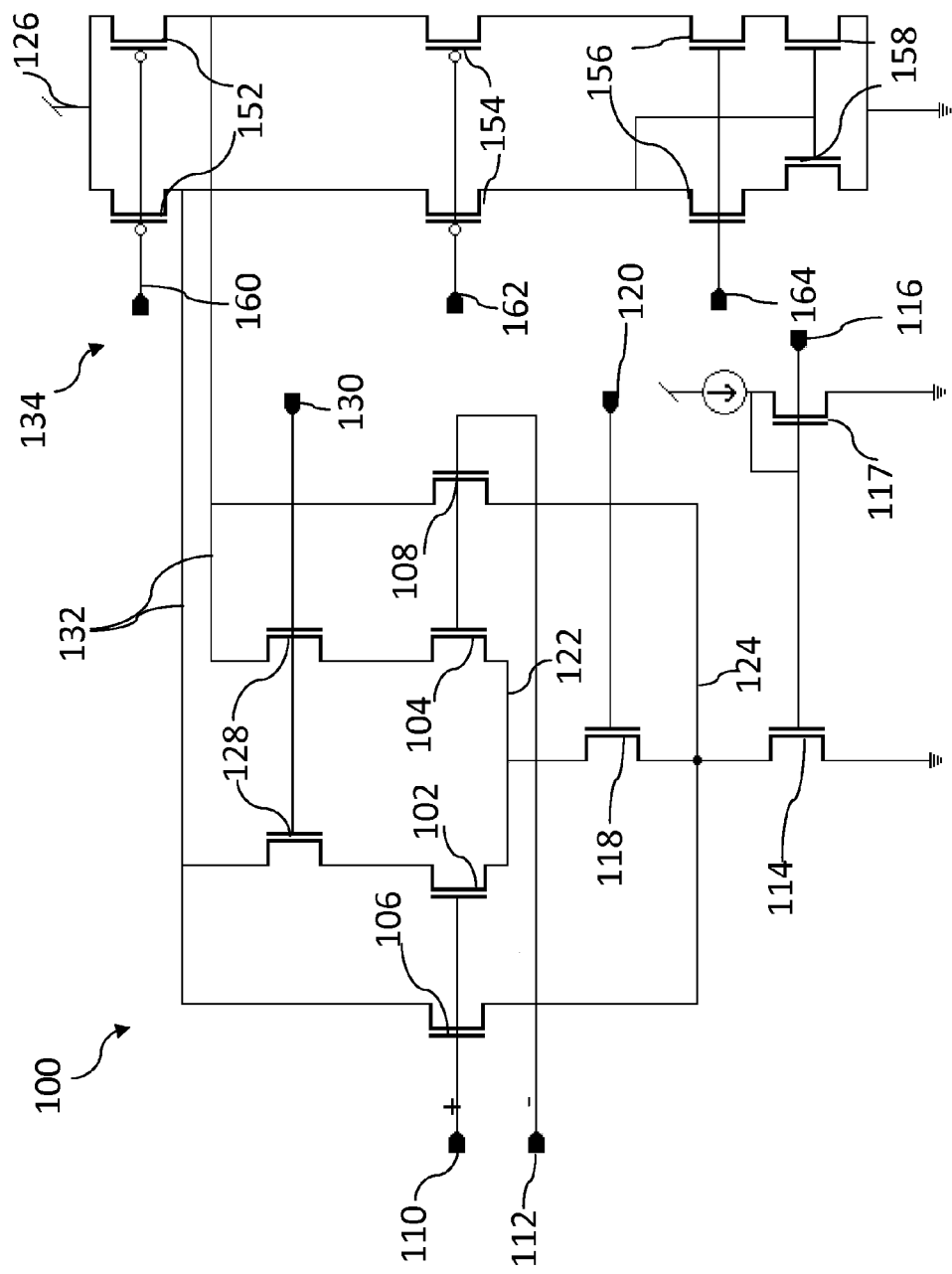
FIG. 1 illustrates a schematic diagram of an amplifier having a rail-to-rail input circuit in accordance with an embodiment of the invention.

An embodiment 100 of the current invention is shown in FIG. 1. A first differential pair includes transistors 102, 104 having threshold voltages that are less than, or negative with respect to, a reference (e.g., 0 V) and a second differential pair includes transistors 106, 108 having threshold voltages that are greater than, or positive with respect to, the same reference (e.g., 0 V). In one embodiment, the transistors 102, 104 in the first differential pair are native NMOS transistors, which have a negative threshold, and the transistors in the second differential pair are normal NMOS transistors, which have a positive threshold. Both native and normal NMOS are sized to operate in weak-inversion mode. It should be stressed, however, that the current invention is not limited to MOSFET operating in weak-inversion mode. In other embodiments, alternatively or in addition, the transistors 102, 104, 106, 108 that make up the first and second differential pairs are MOSFET (either operating in weak-inversion or strong-inversion mode), JFET, bipolar, or any other kind of transistors.

The positive side 110 of a differential input is connected to the gates of the transistors 102, 106 on the left-hand side of the differential pairs and the negative side 112 of the differential input is connected to the gates of the transistors 104, 108 on the right-hand side of the differential pairs; it should be stressed, however, that the current invention is not limited to any particular polarity of the inputs 110, 112. Depending on the common-mode voltage level of the input signals 110, 112, one or both of the differential pairs converts the input voltage signal into an output current signal.

A transistor 114 is biased by a voltage 116 to provide a constant tail current shared by the two differential pairs. The bias voltage 116 may be generated using any technique known in the art, including but not limited to applying a bias current to a diode-connected NMOS transistor 117. In one embodiment, the input differential pairs 102, 104, 106, 108 are sized such that, for the given constant tail current, the input devices 102, 104, 106, 108 operate in weak inversion mode.

A control device 118 is biased by a bias voltage 120 and is connected between a source node 122 of the first differential pair and a source node 124 of the second differential pair. The control device, which may be transistor or other suitable component or circuit, steers current between the first differential pair and the second differential pair in accordance with the common-mode voltage of the input 110, 112. In brief, the control device 118 turns on during low common-mode input voltages, thereby enabling current flow to the first differential pair 102, 104, and switches off at high common-mode input voltages, thereby enabling current flow to the second differential pair 106, 108; at intermediate common-mode voltages, both pairs are on and receive current. Because the two differential pairs share the same constant bias current in this embodiment, the total bias current for the input differential-pairs is constant. And also, because the MOSFETs operate in weak-inversion mode, the total input transconductance is constant regardless of the input common-mode voltage level. A more detailed explanation of the relationship between the common-mode input voltage, the control device 118, and the differential pairs follows for low, intermediate, and high common-mode voltages. If the common-mode input voltage is low (e.g., zero or near zero), that low voltage is applied, via the inputs 110, 112, to the gates of the transistors 102, 104, 106, 108 that make up the two differential pairs. Because the threshold voltages of the transistors 106, 108 of the second differential pair are positive, those transistors are thereby switched off; because the threshold voltages of the transistors 102, 104 that make up the first differential pair are negative, those transistors are on and conducting. The gate-source voltage ($V_{gs}$) of the conducting transistors 102, 104 may be approximately equal to their negative threshold voltages $V_{th-}$ plus $V_{dsat}$, where $V_{dsat}$ is the overdrive voltage (a function of DC bias current). The voltage of the common node 122 of the first differential pair may thus be computed as the voltage of the gates of the conducting transistors 102, 104 (i.e., 0 V, as set by the inputs 110, 112) less the $V_{gs}$ of the conducting transistors 102, 104 (i.e., $V_{th-}$ plus $V_{dsat}$), to thereby yield a voltage of ($-V_{th-}$ minus $V_{dsat}$), which is a positive voltage, assuming the devices' size and DC bias current is configured properly such that $V_{dsat}$ is less than $|V_{th-}|$. The control transistor 118 is configured to operate in its triode region by selection of an appropriate bias voltage 120 (i.e., $V_{b118}$) such that the voltage at its drain is approximately equal to the voltage at its source. Thus, the voltage of the common node 124 of the second differential pair is approximately equal to the voltage of the common node 122 of the first differential pair (e.g., approximately $-V_{th-}$ minus $V_{dsat}$). At this voltage, the tail-current transistor 114 has enough headroom to operate as a current source (given an appropriate bias voltage 116).

If the common-mode input voltage increases to an intermediate value, the voltage of the common node 122 of the first differential pair increases, approximately linearly, in response. The tail current through the tail-current transistor 114 remains approximately constant, however, and the control transistor 118 permits the voltage of the common node 124 of the second differential pair to increase linearly in the beginning and then also remain approximately constant once node 124 reaches ($V_{b118}-V_{th}-V_{dsat}$), wherein $V_{b118}$, $V_{th}$ and $V_{dsat}$ are the bias voltage, threshold voltage and overdrive voltage of transistor 118. As a result, the $V_{gs}$ of the transistors 106, 108 of the second differential pair increases (again, because the voltage of their source node 124 is remaining constant while the voltage of their gate nodes 110, 112, is increasing with the increasing common-mode voltage). As the input common-mode voltage continues to increase, the transistors 106, 108 of the second differential pair gradually turn on. Therefore, threshold voltage of the transistors 106, 108, 118 and the bias voltage 120 (i.e. $V_{b118}$) are set when the transition starts. The voltage of the common node 124 of the second differential pair increases as those transistors 106, 108 turn on, which reduces the $V_{gs}$ of the control transistor 118 (because the voltage of the source node 124 of the control transistor 118 increases while the voltage of the gate node, bias voltage 120, namely $V_{b118}$, remains constant). The lower $V_{gs}$ of the control transistor 118 reduces the tail current flowing through the transistors 102, 104 of the first differential pair as the tail current flowing though the transistors 106, 108 of the second differential pair increases, thus keeping the overall tail current constant. Because all of the differential-pair transistors 102, 104, 106, 108 are conducting, they are all simultaneously functioning as input devices.

If the common-mode input voltage increases to a high value (to, e.g., approximately three-quarters of the power-supply voltage 126), the voltage on the common node 124 of the second differential pair further increases and the $V_{gs}$ of the control transistor 118 continues to decrease. The transition point may be set by the bias voltage 120 of the control transistor 118, as one of skill in the art will understand, and may be adjusted as necessary for a given application. Eventually, the control transistor 118 shuts off, causing the transistors 102, 104 of the first differential pair to shut off as well. At this point, the transistors 106, 108 of the second differential pair conduct all of the tail current and function as the sole input devices. Additional devices 128, biased by a voltage 130, ensure that the transistors 102, 104 in the first differential pair do not reversely conduct when their gate voltage (i.e., the input voltage 110, 112) approaches or exceeds the voltage at the nodes 132 connecting to the active loads 134. The devices 128 may be transistors, as shown, or diodes.

In one embodiment, the threshold voltage $V_{th-}$ of the negative-threshold devices 102, 104 is roughly −280 mV, and the threshold voltage $V_{th+}$ of the positive-threshold devices 106, 108 is roughly 700 mV. The voltage of the power supply 126 is 1.8 V. The tail-current bias voltage 116 is set to enable a tail current of 1 µA through the tail-current transistor 114, and the bias voltage 120 of the control transistor 118 is 1 V. With appropriate device sizes, the $V_{dsat}$ on 102 and 104 is roughly 30 mV. At low common-mode voltages, the voltage of the common node 122 of the first differential pair is approximately 250 mV (because, as described above, the $V_{gs}$ of the transistors 102, 104 is $V_{th-}$ plus $V_{dsat}$: approximately −280 mV plus 30 mV, or −250 mV). The voltage of the common node 124 of the second differential pair is also roughly equal to 250 mV as transistor 118 is working in triode region with very small $V_{ds}$. Once the input common-mode voltage increases to approximately 1.0 V, the devices 106, 108 of the second differential pair begin to turn on, and the devices 102, 104 shut of when the input common-mode voltage reaches approximately 1.3 V.

Figure 2:
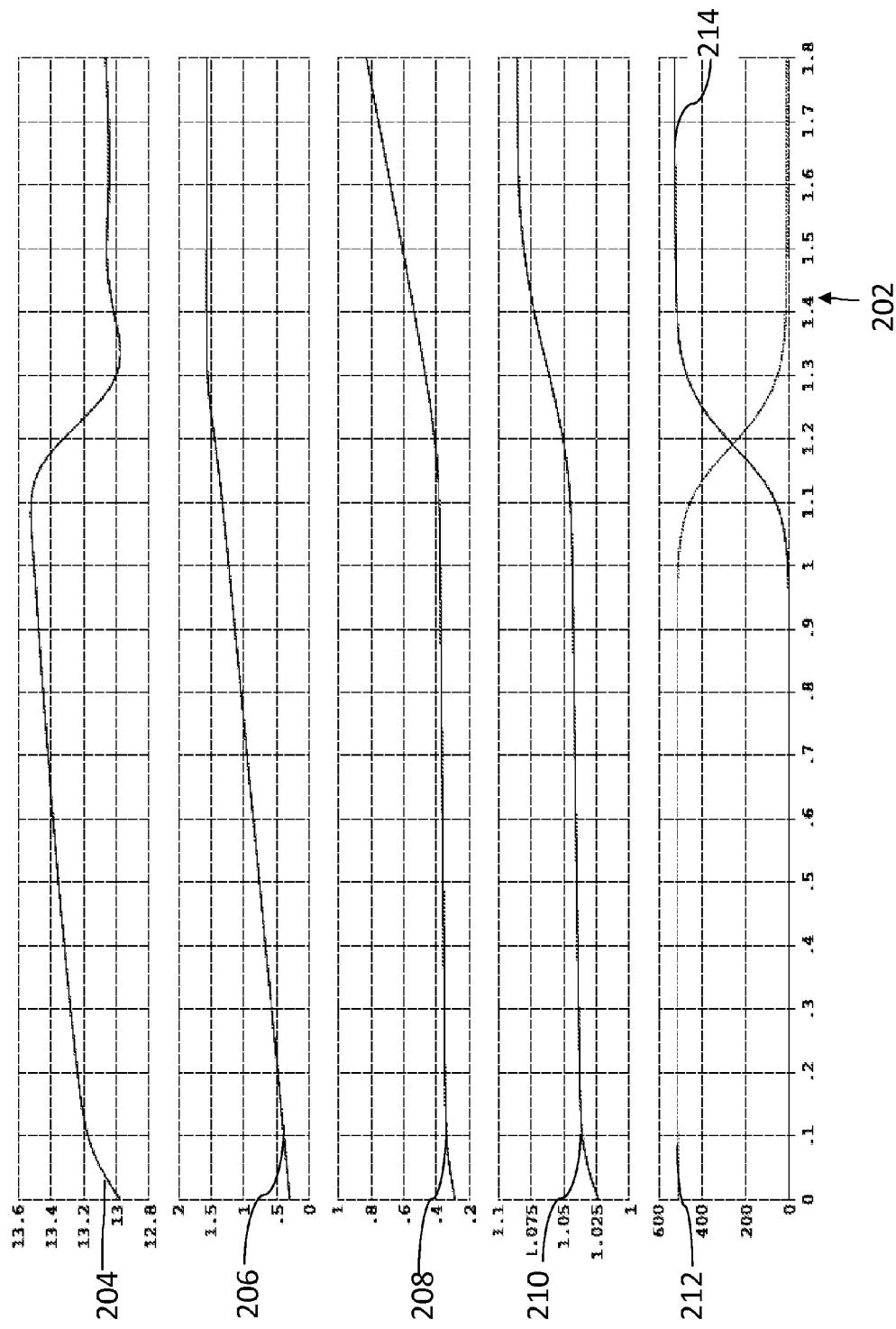
FIG. 2 illustrates a graph of sample current, voltage, and input transconductance values as functions of common-mode voltage in accordance with an embodiment of the invention.

A more detailed relationship between the input common-mode voltage and the voltage and current levels in the circuit 100 is shown in FIG. 2 for one embodiment of the current invention. The x-axis shows the common-mode input voltage 202 versus, on the y-axes, total transconductance 204 (in units of amps/volt), the voltage at the common node 122 of the first differential pair 206, the voltage at the common node 124 of the second differential pair 208, the tail current 210 through the tail-current transistor 114, and the currents 212, 214 through the left-hand differential devices 102, 106, respectively. As FIG. 2 shows, the total transconductance 204 varies only between approximately 13.0 and 13.5 over the entire common-mode range (0 to 1.8 V), or less than approximately 4%. The steering of the tail current between the first and second differential pairs in accordance with the common-mode voltage 202 is evident as the current 212 through the negative-threshold device 102 falls when the current 214 through the positive-threshold device 106 rises.

One embodiment of the active load 134 is shown in FIG. 1. In this embodiment, PMOS transistors 152 are biased by voltages 160 to provide a current that is constant, regardless of the level of the common-mode voltage 110, 112. This constant current may be selected to optimize noise performance of the amplifier.

Embodiments of the current invention may be used in any application in which a differential input voltage may have a common-mode voltage anywhere between power and ground or even beyond power and ground. In particular, the circuits described herein may be ideally suited for low-power low noise applications. For example, an embodiment of the current invention may be used for designing low power low noise rail-to-rail input operational amplifiers and low power low noise instrumentation amplifiers.

Figure 3:
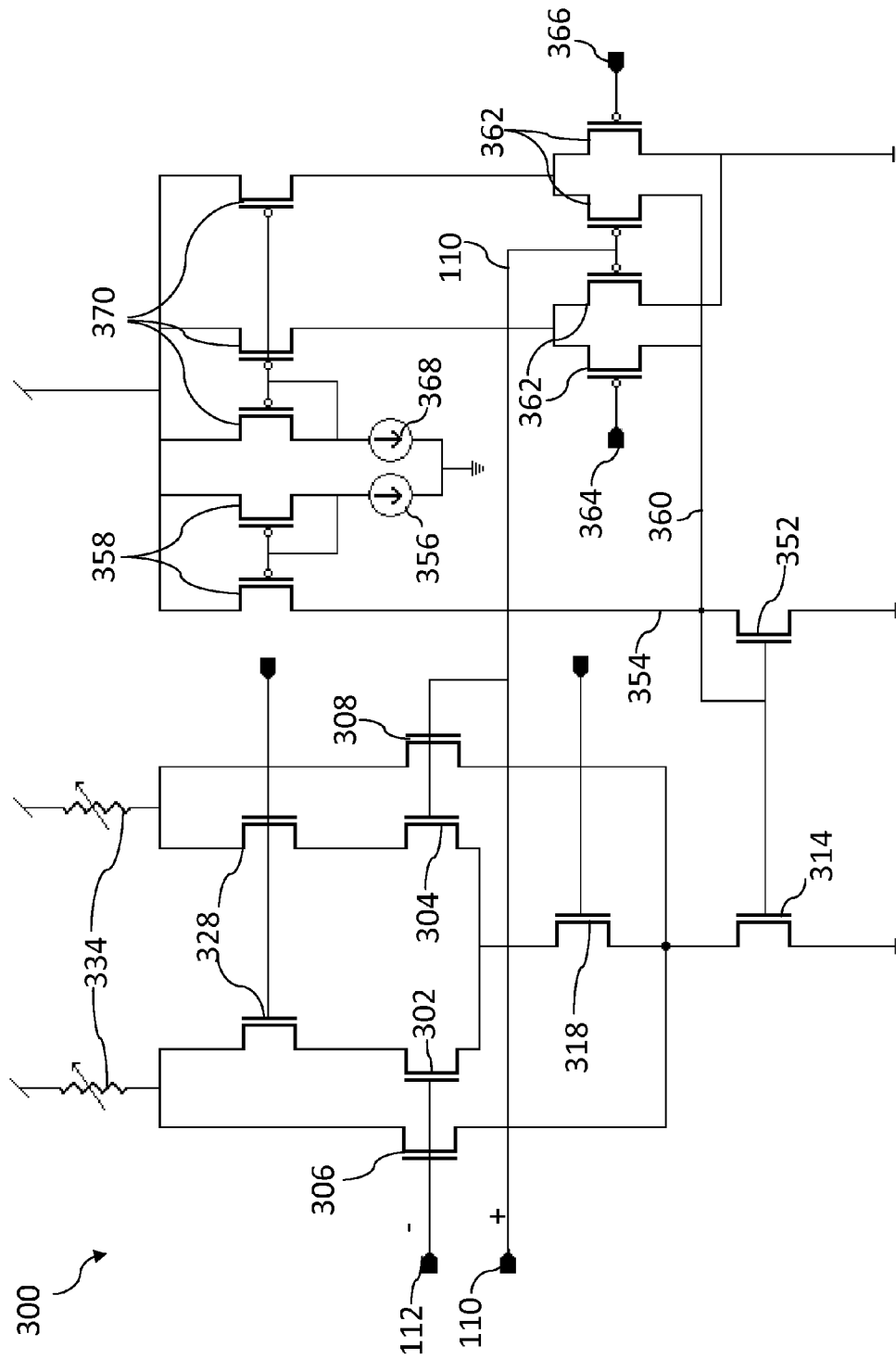
FIG. 3 illustrates a schematic diagram of another amplifier having a rail-to-rail input circuit in accordance with an embodiment of the invention.

FIG. 3 illustrates an embodiment 300 of the current invention in which MOSFET 302, 304 in the first differential pair and MOSFET 306, 308 in the second differential pair operate in their strong-inversion modes. The control 318 and bias 314, 328 transistors and the active loads 334 operate in a manner similar to that of the corresponding components in FIG. 1. In the embodiment 300 in FIG. 3, the tail-current transistor is controlled by a current-mirror transistor 352 that sums a first current 354 supplied by a first current source 356 (routed via a current mirror 358) and a second current 360 that is generated as a function of one of the differential inputs 110, 112 (here, the positive input 110). Differential pairs 362 compare the input 110 to first and second voltage references 364, 366 (which are biased by a second current source 368 and another current mirror 370) to provide the second, input-dependent current 360.

As explained above, for MOSFETs operating in strong inversion and under constant bias current, the total transconductance increases during transition. If a constant transconductance is desirable, a bias adjustment circuit as shown in FIG. 3 may be employed. According to the common mode level at which a transition between two differential pairs starts and stops, voltage references 364 and 366 are set appropriately. In operation, the first current 354 is fixed at a nominal value and the second current 360 varies as a function of the input. As a result of the combination of the two currents 354, 360, the tail current through the tail-current transistor 314 may reduce during the transition area at which both differential pairs are on. The reduction on the bias current during the transition region ensures the transconductance of the circuit 300 remains relatively constant across the input common-mode range. The current invention is not limited to any particular configuration of the input-pair transistors 302, 304, 306, 308 nor any particular input-dependent bias network 352, 356, 358, 362, 368, 370, as one of skill in the art will understand.

Figure 4:
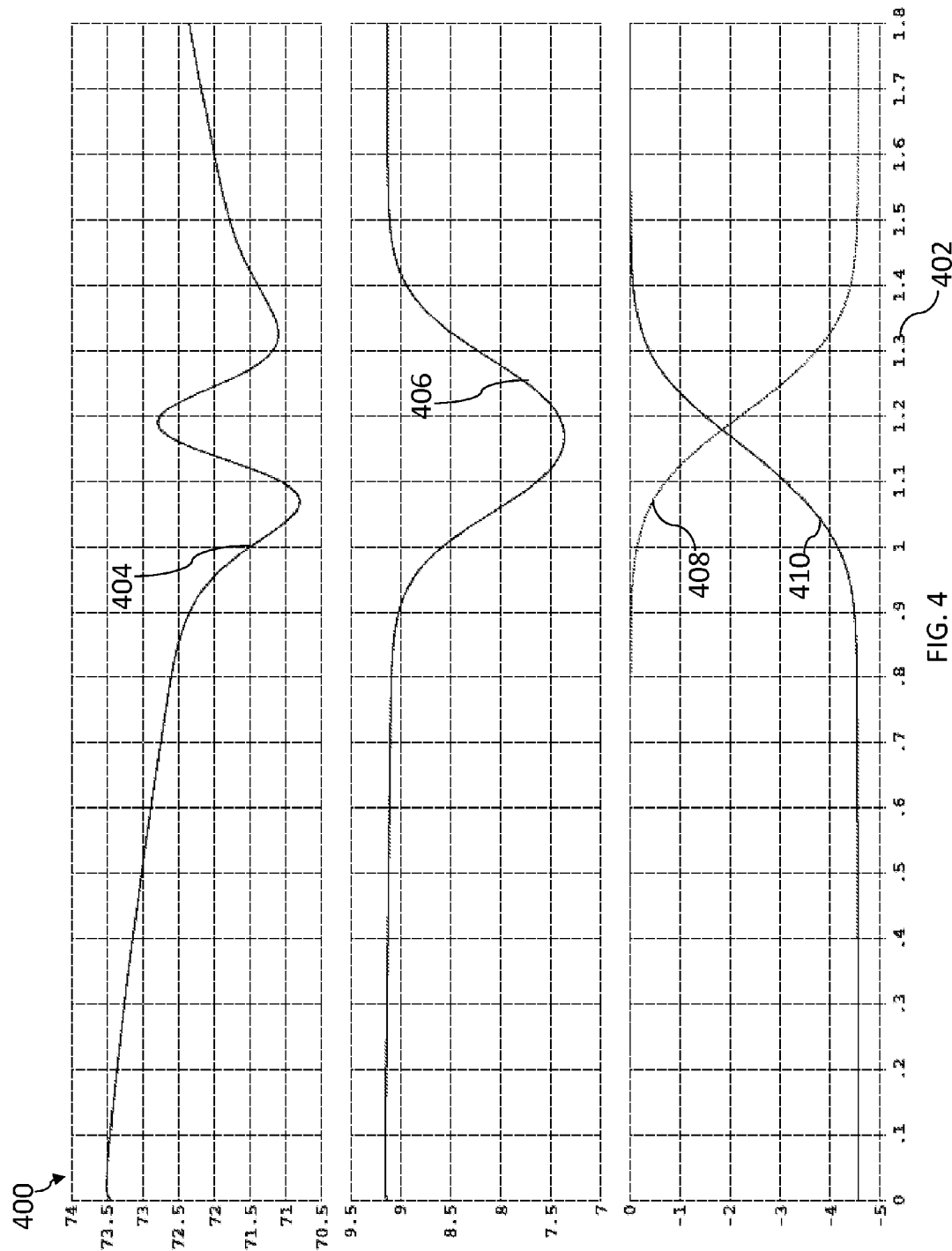
FIG. 4 illustrates a graph of sample current and input transconductance values as functions of common-mode voltage for the circuit of FIG. 3 in accordance with an embodiment of the invention.

FIG. 4 is a graph 400 of an example of the operation of the circuit 300 illustrated in FIG. 3 as a function of input-mode voltage 402. As the figure shows, the total transconductance 404 varies between approximately 71 and 73.5 throughout the entire range 402 after the total bias current 406 (supplied by transistor 314) is adjusted accordingly during the transition area. Also pictured is the current 408, 410 through each of the differential pairs.

Figure 5:
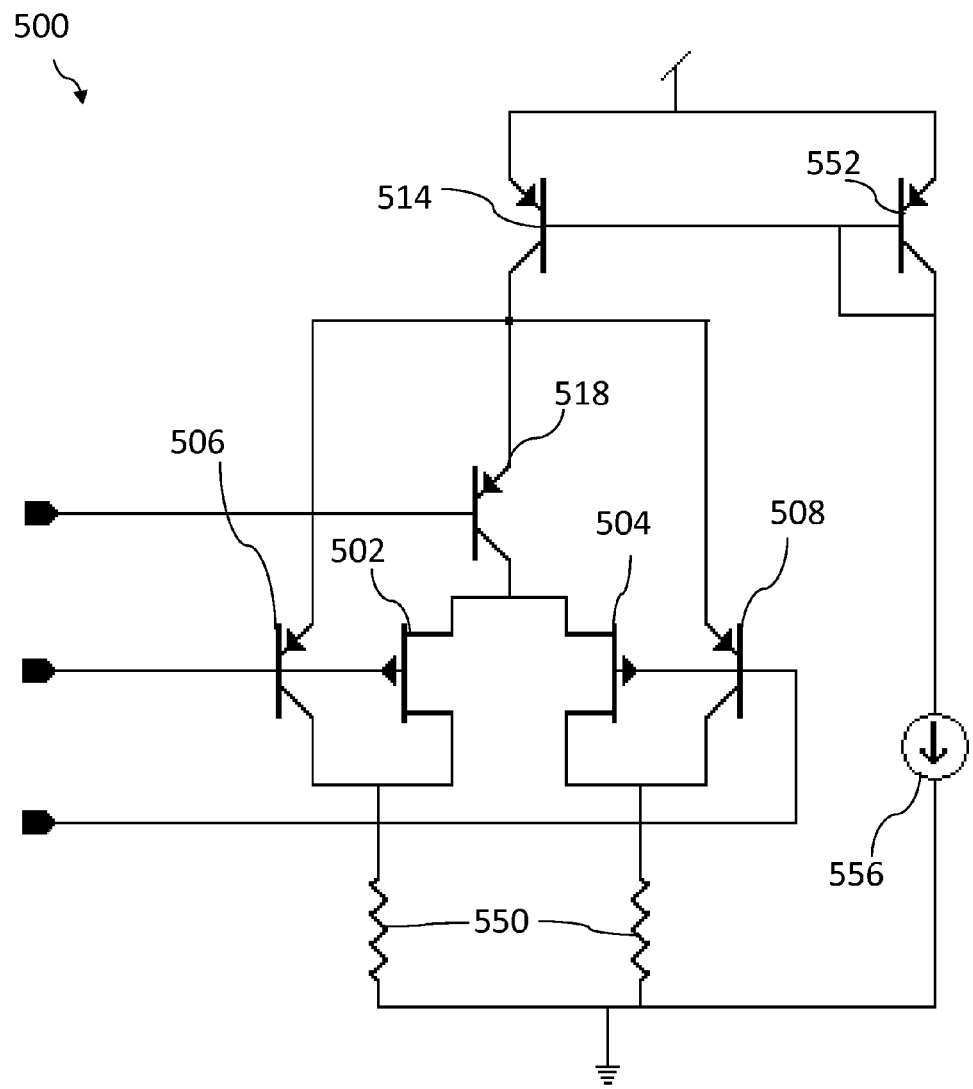
FIG. 5 illustrates a schematic diagram of an implementation of the input circuit that uses BJT and JFET transistors in accordance with an embodiment of the invention.

FIG. 5 illustrates another embodiment 500 of the invention in which one input differential pair includes BJT transistors 502, 504 and a second input differential pair includes JFET transistors 506, 508. The tail-current transistor 514 and control transistor 518 are also BJTs and, as one of skill in the art will understand, function in a manner similar to the corresponding elements in FIG. 1. The circuit 500 is biased by resistors 550, a current-mirror transistor 552, and a current source 556, but one of skill in the art will understand that any suitable bias network may be used instead.

Figure 6:
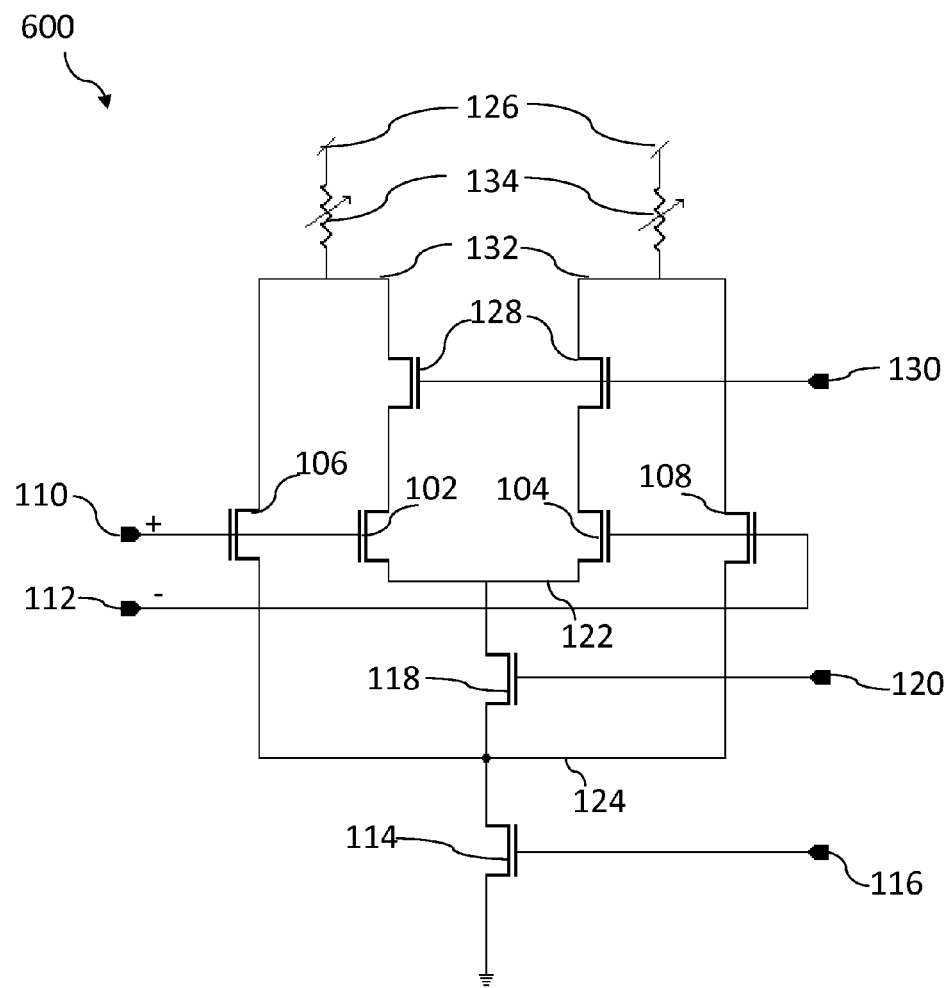
FIG. 6 illustrates a schematic diagram of a rail-to-rail input circuit in accordance with an embodiment of the invention having transistors that may be MOSFETs, BJTs, or JFETs.
Figure 7:
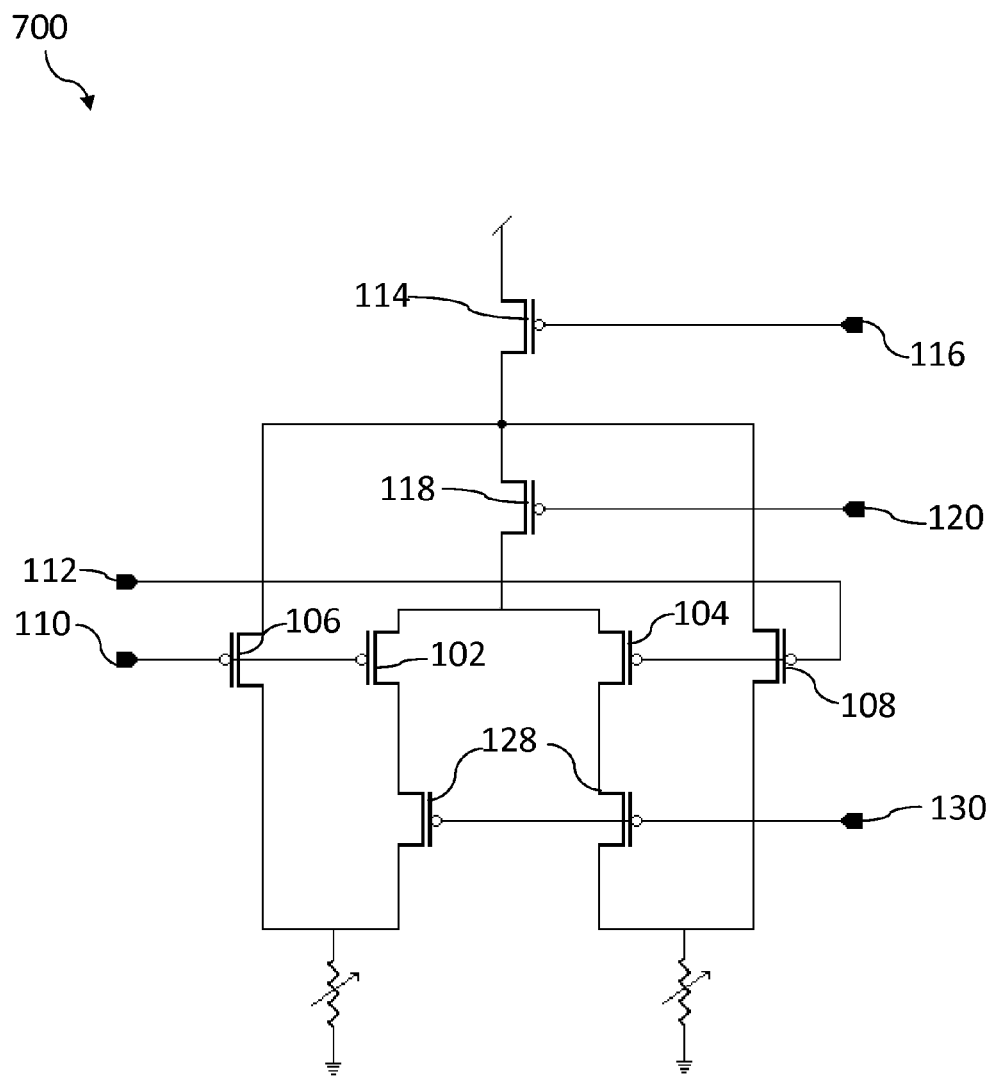
FIG. 7 illustrates a schematic diagram of another implementation of the input circuit that is a dual of FIG. 6.

FIG. 6 illustrates a simplified example 600 of a circuit constructed in accordance with an embodiment of the invention. The transistors in this diagram (including the differential-pair transistors 102, 104, 106, 108) may be MOSFETs, BJTs, and/or JFETs. The active loads 134 are depicted as symbols; any active loads, as known in the art, are within the scope of the current invention. FIG. 7 illustrates an alternative embodiment of the circuit of 600 of FIG. 6 in which the load 134, tail current source 114, control device 118 and input devices 102, 104, 106, 108 are PMOS devices. The transistors in this diagram may similarly be MOSFETs, BJTs, and/or JFETs.

Figure 8:
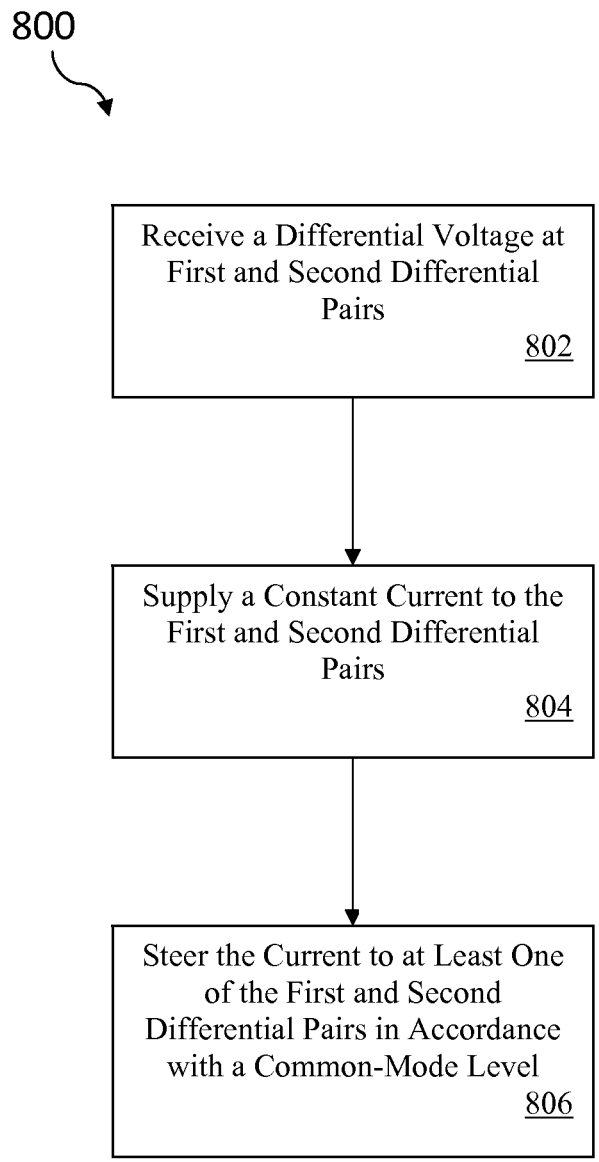
FIG. 8 illustrates a flowchart of a method for amplifying an input signal in accordance with an embodiment of the invention.

FIG. 8 illustrates a flow diagram 800 of the invention. In a first step 802, the differential input voltage is received at a first differential pair having devices of a first threshold voltage and at a second differential pair having devices of a second threshold voltage (e.g., the inputs of the two pairs are connected in parallel). In a second step 804, a tail current is supplied to the first and second differential pairs. This step may occur before or after the first step 802, and the current invention is not limited to any particular order of any the steps. In a third step 806, the current is steered to at least one of the first and second differential pairs in accordance with a common-mode level of the differential input voltage. That is, as described above, one of the pairs is on and one is off at high or low common-mode levels and, at intermediate levels, both pairs are on.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A rail-to-rail differential input circuit comprising:
    a first differential pair configured to receive a differential input, the first differential pair comprising first devices having a first threshold voltage;
    a second differential pair configured to receive the differential input in parallel with the first differential pair, the second differential pair comprising second devices having a second threshold voltage different from the first threshold voltage;
    a tail current source configured to provide a tail current shared between the first and second differential pairs; and
    a control device, connected between common source or common emitter nodes of the first and second differential pairs, configured to steer the tail current between the first and second differential pairs in accordance with a common-mode level of the differential input.

2. The circuit of claim 1, wherein the first threshold voltage is negative and the second threshold voltage is positive.

3. The circuit of claim 1, wherein the first and second threshold voltages are both positive or both negative.

4. The circuit of claim 1, wherein the control device consists of a single transistor.

5. The circuit of claim 1, wherein the first and second devices comprise MOSFETs, BJTs, or JFETs.

6. The circuit of claim 1, further comprising an active load configured to supply a constant current to the first and second differential pairs.

7. The circuit of claim 1, wherein, at a low common-mode level of the differential input, the first differential pair in on and the second differential pair is off.

8. The circuit of claim 1, wherein, at an intermediate common-mode level of the differential input, the first and second differential pairs both turn on.

9. The circuit of claim 1, wherein, at a high common-mode level of the differential input, the first differential pair is off and the second differential pair is on.

10. The circuit of claim 1, further comprising safety devices configured to prevent the first differential pair from becoming forward-biased.

11. The circuit of claim 10, wherein the safety devices comprise transistors or diodes.

12. The circuit of claim 1, further comprising bias voltage sources configured to supply bias voltages to the tail current source and control device.

13. A method for processing a differential input voltage having a rail-to-rail common-mode range, the method comprising:
supplying a tail current to be shared between a first differential pair comprising first devices having a first threshold voltage and a second differential pair comprising second devices having a second threshold voltage;
sharing the tail current between the first and second differential pairs; and
steering the tail current to at least one of the first and second differential pairs in accordance with a common-mode level of the differential input voltage.

14. The method of claim 13, wherein the first threshold voltage is negative and the second threshold voltage is positive.

15. The method of claim 13, wherein the first and second threshold voltages are both negative or both positive.

16. The method of claim 13, in which the tail current may be adjusted accordingly during transition region.

17. The method of claim 13, further comprising providing an output current proportional to the differential input voltage.

18. The method of claim 13, wherein a transconductance of the first and second differential pairs remains nearly constant across the rail-to-rail common-mode range.

19. The method of claim 13, wherein the first differential pair amplifies the input voltage at low common-mode levels and the second differential pair amplifies the input voltage at high common-mode levels.

20. The method of claim 13, wherein the first and second differential pairs both process the input voltage at intermediate common-mode levels.

21. The method of claim 13, further comprising providing an output signal that is an amplified version of the input voltage.

22. The method of claim 13, further comprising providing an output signal that is a result of comparing the input voltage to a reference.

* * * * *

UNITED STATES PATENT AND TRADEMARK OFFICE
CERTIFICATE OF CORRECTION

| | | |
|---|---|---|
| PATENT NO. | : 8,680,922 B2 | Page 1 of 1 |
| APPLICATION NO. | : 13/352654 | |
| DATED | : March 25, 2014 | |
| INVENTOR(S) | : Wan | |

It is certified that error appears in the above-identified patent and that said Letters Patent is hereby corrected as shown below:

On the Title Page (item 54, Title) and in the Specification, in column 1 at line 1, Change "RAIL-TO RAIL" to --RAIL-TO-RAIL--.

In the Specification

In column 2 at line 45, Change "MOS FET" to --MOSFET--.

In column 3 at lines 52-53 (approx.), Change "invention;" to --invention.--.

In the Claims

In column 9 at line 16, In Claim 7, Change "in" to --is--.

Signed and Sealed this
Ninth Day of September, 2014

Michelle K. Lee
*Deputy Director of the United States Patent and Trademark Office*